(12) United States Patent
Pitt et al.

(10) Patent No.: US 8,097,321 B2
(45) Date of Patent: Jan. 17, 2012

(54) RELEASE FILMS

(75) Inventors: Andrew Martin Pitt, Malvern (GB); David Edward Higgins, Whitby (GB)

(73) Assignee: Qinetiq Limited (GB)

( * ) Notice: Subject to any disclaimer, the term of this patent is extended or adjusted under 35 U.S.C. 154(b) by 1493 days.

(21) Appl. No.: 10/471,309

(22) PCT Filed: Mar. 13, 2002

(86) PCT No.: PCT/GB02/00997
§ 371 (c)(1),
(2), (4) Date: Sep. 9, 2003

(87) PCT Pub. No.: WO02/072683
PCT Pub. Date: Sep. 19, 2002

(65) Prior Publication Data
US 2004/0076819 A1    Apr. 22, 2004

(30) Foreign Application Priority Data

Mar. 13, 2001 (GB) .................................. 0106059.9

(51) Int. Cl.
*B32B 5/16* (2006.01)
*B32B 15/00* (2006.01)
*B32B 15/16* (2006.01)
*B32B 19/02* (2006.01)
*C23C 16/01* (2006.01)
*C23C 16/06* (2006.01)

(52) U.S. Cl. ...... 428/40.1; 428/41.8; 428/323; 428/336; 428/454; 428/457; 427/147; 427/149; 427/250

(58) Field of Classification Search .................. 428/325, 428/328
See application file for complete search history.

(56) References Cited

U.S. PATENT DOCUMENTS

| | | | | |
|---|---|---|---|---|
| 3,872,038 A * | 3/1975 | Adams et al. | ................. | 523/336 |
| 4,222,973 A * | 9/1980 | Kasper et al. | ................. | 264/430 |
| 4,321,087 A * | 3/1982 | Levine et al. | .................. | 75/356 |
| 5,135,812 A | 8/1992 | Phillips et al. | ................. | 428/403 |
| 5,571,614 A | 11/1996 | Harrison et al. | ............. | 428/331 |
| 5,795,649 A | 8/1998 | Higgins et al. | ................ | 428/336 |
| 5,807,781 A * | 9/1998 | Reinhardt et al. | ........... | 428/341 |
| 6,365,284 B1 * | 4/2002 | Liposcak | ...................... | 428/621 |
| 2002/0076540 A1 * | 6/2002 | Badesha et al. | .............. | 428/212 |

FOREIGN PATENT DOCUMENTS

| | | |
|---|---|---|
| DE | 1 903 568 | 8/1970 |
| DE | 19 03 568 | 8/1970 |
| EP | 0 087 899 | 9/1983 |
| GB | 2 322 867 | 9/1998 |
| JP | 52055710 A * | 5/1977 |
| JP | 57 168745 | 8/1982 |
| JP | 57-168745 | 10/1982 |
| JP | 63-230310 | 9/1988 |
| JP | 63 230310 | 9/1988 |
| JP | 10-278189 | 10/1998 |
| JP | 10278189 | 10/1998 |

* cited by examiner

*Primary Examiner* — Monique Jackson
(74) *Attorney, Agent, or Firm* — McDonnell Boehnen Hulbert & Berghoff LLP

(57) ABSTRACT

This invention relates to the use of vermiculite and layer minerals in general release films.

14 Claims, 3 Drawing Sheets

Structure of Vermiculite

RELEASE FILMS

BACKGROUND

1. Field of the Invention

This invention relates to release films and layers and materials formed and released from said release films and layers. It also relates to methods of manufacture of the aforesaid. The invention also relates to release agents.

2. Description of Related Technology

Release films and layers are known, for example U.S. Pat. No. 5,795,649 describes the use of inter alia polyacrylic type release layers on polyester film.

Typically a layer of material is deposited on to a release film which comprises a substrate and a release layer said release layer comprising a release agent. The layer of material is then subsequently released from the release layer/release agent by use of an organic solvent such as acetone. The layer of material released from the release agent/layer may be of a desired quality. For example it is known that metal flakes of a particular quality can be obtained by such a technique which makes them particularly useful inter alia for use as a pigment in coatings such as paints. The plate-like structure obtainable by such a process means that it may be possible, for example, to obtain paint of a more reflective nature which in certain circumstances may be desirable. U.S. Pat. No. 5,135,812 describes optically variable thin film flake and its use in ink and paint vehicles to provide optically variable inks, paints and the like.

There is a need for alternative release films and release agents and release layers comprising said agents. Some of the disadvantages associated with known release films is that it is necessary to use an expensive and environmentally unfriendly solvent to release the deposited material e.g. a metal containing compound—for example U.S. Pat. No. 5,795,649 is limited to the use of organic solvents such as acetone. It is also the case that alternative release films/agents/layers may afford a wider range of material that can be successfully deposited and subsequently released with the possibility that said released material may be of a particularly useful quality, for example it may possess particular optical properties.

EP 0087889 describes the production of vermiculite products and a suspension for use therein.

U.S. 5,571,614 describes polymeric packaging film coated with compositions comprising a layer mineral such as vermiculite and a cross-linked resin. The function of the resin is essentially to bind the vermiculite layer to the substrate, and vermiculite is acknowledged as being particularly suitable for providing gas barrier properties in particular with respect to oxygen. To provide that function the coating layer must remain in position and, to that end, a protective overcoat layer of a film-forming polymeric resin may be applied.

It has unexpectedly been found by the current inventors that films based on the films described in U.S. Pat. No. 5,571,614 are suitable for use as release films and that said release films may be used for making thin layers of material suitable for a number of applications.

SUMMARY OF THE INVENTION

According to a first aspect of this invention the use of vermiculite as a release agent is provided.

According to a 1b aspect of the invention the use of a substrate coated on at least one surface thereof with a release layer said release layer comprising vermiculite plus binder as a release film is provided.

According to a second aspect of the present invention a release film comprises a substrate coated on at least one surface thereof with a release layer said release layer comprising vermiculite plus binder.

In an alternative embodiment of the second aspect of the invention the vermiculite may provide the function of binder and an additional binder is not necessary.

According to a 2a aspect of the invention a release film according to the second aspect of the invention further comprises a layer of deposited material on the release layer.

According to a 2b aspect of the invention a release film according to the 2a aspect of the present invention further comprises a layer of adhesive on the exposed layer of the deposited material.

According to a 2c aspect of the invention a release film according to the 2b aspect of the present invention further comprises a layer of liner on the exposed layer of the adhesive.

With respect to aspects 2b and 2c such release films are effectively so-called appliqués in that they offer the possibility of applying the layer of deposited material on to a surface, in a similar manner as a sheet of wallpaper would be applied to a wall.

As such according to a 2d aspect of the present invention a method of applying a layer of material to a surface comprises the steps of:

coating a substrate on at least one surface thereof with an aqueous solution of binder and vermiculite, heating the coated substrate at a temperature sufficient for drying the binder and vermiculite to the substrate, depositing a layer of material on to the coated layer of the substrate, optionally applying heat before and/or during and/or after the deposition of the material, depositing a layer of adhesive onto the deposited material, depositing a liner onto the layer of adhesive, separating the layers at the interface between the vermiculite/binder plus deposited material such that there is an exposed layer of deposited material, removing the liner, contacting the exposed adhesive layer to a surface.

In the above method the layer may be stuck to a surface and then the substrate plus vermiculite/binder layer may be removed. Alternatively instead of the adhesive layer a solution of polymer e.g. rubber such as Kraton (commercially available from Shell Chemicals, Heronbridge House, Chester Business Park, Chester) which is a polyisoprene may be coated on to the layer of deposited material and dried, the polymer (e.g. Kraton) plus the layer of deposited material may then be peeled from the substrate to expose a surface of the deposited material which may then be coated with an adhesive and optionally a removable release liner.

According to a 2e aspect of the invention an appliqué comprises:

a substrate coated on at least one surface-thereof with a release layer said release layer comprising vermiculite plus binder, a layer of deposited material on the release layer, a layer of adhesive on the deposited layer, a liner in contact with the adhesive layer.

According to a 2f aspect of the invention an appliqué according to the 2e aspect of the present invention is provided wherein the release layer has been removed.

Preferably a protective layer is added to the exposed layer of deposited material.

Suitable adhesives include hot melt adhesives and adhesives e.g. EVA, coated from solution or dispersions e.g. from toluene.

According to a third aspect of the present invention a method of making a release film comprises the steps of:
coating a substrate on at least one surface thereof with an aqueous solution of binder plus vermiculite,
heating the coated substrate at a temperature sufficient for drying the binder plus vermiculite to the film.

Preferably the dried coat thickness of vermiculite plus binder is 0.002-2 microns, more preferably 0.05-0.5 microns, even more preferably about 0.1 microns.

According to a fourth aspect of the present invention a method according to the third aspect of the present invention is provided comprising the further step of depositing a layer of material onto the coated film.

According to a fifth aspect of the present invention a method according to the fourth aspect of the present invention is provided comprising the further step of the addition of heat.

Heat may be applied before and/or during and/or after the deposition of the layer of material.

According to a sixth aspect of the present invention a method according to the fourth or fifth aspect of the present invention is provided comprising the additional step of releasing the layer of material from the coated film.

According to the seventh aspect of the present invention materials obtained/obtainable by the sixth aspect of the present invention are provided.

A further aspect of the present invention provides for a coating comprising materials obtained/obtainable according to the seventh aspect of the present invention.

The above aspects of the invention may further comprise a surfactant in the solution of binder plus vermiculite, i.e. the release layer may also comprise one or more surfactants. Examples of surfactant include those that allow the whole or substantially the whole of the substrate surface to be wet. These include commercially available Synperonic NP10 which is a nonylphenol ethoxylate where typically 10 moles of ethylene oxide are incorporated in each mole of Synperonic NP10. This can be obtained from Uniqema, Wilton Centre, Middlesborough, Cleveland.

The release coating comprises preferably 0.5% by weight-20% by weight of solids in water and more preferably 1-10% by weight in water.

In general the layer of deposited material may comprise a series of layers or be a single layer.

Preferably the layer of deposited material is a metal containing compound or a glass. Typical metals include aluminium, chromium, magnesium, copper, vanadium, nickel, zinc, tin, silver, gold, titanium, silicon, bismuth or any compound containing the foregoing metals or combination thereof. These compounds include oxides, nitrides, fluorides and carbides. In particular the layer of material is preferably Aluminium or Vanadium dioxide ($VO_2$). Deposited materials include dielectrics and semi-conductors.

The metal containing layer(s) can preferably be of a thickness which ranges from about 0.005 to about 50 microns, particularly from about 0.1 to about 5 microns and more particularly from about 0.25 to about 2 microns.

Preferably the layer of material is deposited by means of, in the case of metal-containing materials, by conventional methods including vapour and vacuum deposition such as so-called sputtering techniques. Deposition may be also be carried out for materials in general using SOL-GEL techniques. These are all well known to those skilled in the art and are described in various papers including Schmidt et al, Mat. Res. Soc. Symp. Proc. Vol 121 pp743-53; Huling et al, J. Am. Ceram. Soc., 71(4), C-222-C-224, 1998; Handbook of Thin Film Technology McGraw Hill, ISBN 007-019025-9.

Preferably the binder is an organic binder, more specifically a polymeric binder. More preferably the binder is a water soluble polymeric binder which even more preferably is thermosetting. Specific preferred examples include formaldehyde containing materials e.g. urea formaldehyde and melamine formaldehyde or a derivative thereof. The function of the binder is primarily for adhering the release layer to the substrate. The binder is preferably a cross-linking agent. Suitable binders include those "cross-linking" agents listed in U.S. Pat. No. 5,571,614—the contents of which are hereby incorporated by reference. The preferred melamine formaldehyde may also be referred to as melamine formaldehyde resin derivatives. Many of the commercially available resins may comprise other resins as impurities. A preferred derivative is methoxymethyl methylol melamine formaldehyde.

The release layer is preferably comprised of at least 5% by weight of the binder, and more preferably 10-50% by weight, even more preferably 25-45% by weight.

Preferably the substrate is a polymer. In particular the following polymers are included polyester, polypropylene, polyethylene, polyethylene naphthanate, polyether sulphone, polybutene, olefin copolymers, polyamide, polyimides, polycarbonate and polyacrylonitrile even more preferably are those polymer substrates which are capable of being heated to about 450-500° C. A particularly useful example of a polymer is commercially available (from DuPont) Kapton® film which is made from polyimide. Kaladex, available from DuPont Teijin Films, UK Ltd is also suitable. The substrate may comprise metal.

With respect to heating the coated substrate of the third aspect of the invention, then typical temperatures are 110-120° C. particularly when the binder is melamine formaldehyde. It is also the case that said heating should take place in the absence of or substantially in the absence of air—in particular this may result in a smoother surface due to less blistering of the surface.

By liner is meant any layer of material suitable for preventing the adhesive layer from being exposed and is readily removable. The liner may also be referred to as a release film or paper and examples of these are well known to those skilled in the art.

Preferably the coated layer and layer of material of the fourth/fifth aspect of the current invention are heated to a minimum temperature of about 150° C. This will depend partly on the nature of the material that is being deposited, for example when the deposited material is Vanadium dioxide then the structure is heated to temperatures of around 450° C. so that in certain circumstances a particular crystal structure may be obtained. When such high temperatures are required then the substrate is made preferably at least partly from Kapton®, even more preferably the substrate is made exclusively from Kapton®.

Heating may take place before and/or during and/or after deposition of the layer of material.

Preferably the deposited material is released from the vermiculite/binder release coated film by placing the release film in to a solvent, in addition there may optionally be present one or more surfactants. Preferably the solvent is water. The layer of material obtained/obtainable from the various aspects of the invention may be further processed after it has been released. When the material is metal containing then the metal may be released in the form of flakes. Such flakes can be readily collected and processed into a pigment for inks or paint coatings applications. The flakes can be collected and processed to the desired size as described in U.S. Pat. No.

5,135,812 which is incorporated herein by reference. It may be the case that small quantities of binder and/or vermiculite are retained by the released material. These retained materials may advantageously modify the electrical and/or optical and/or chemical and/or mechanical properties of the released layer—this can be considered as doping when certain criteria are met. The coated release film may also be heated prior to contact with solvent in order to aid release of the deposited material.

The methods of the current invention also advantageously allow in certain circumstances for the removal of layers, in particular metallised layers, in a single or substantially single sheet.

By vermiculite is included a phyllosilicate layer mineral slurried in water, more particularly vermiculite platelets/vermiculite lamellae slurried in water after chemical exfoliation. Most preferably is meant vermiculite lamellae slurried in water after ion exchanging divalent cations with Lithium cations—methods for obtaining such a form of Vermiculite are described in U.S. Pat. No. 5,571,614 the contents of which are herein incorporated by reference. It should be noted that the ion exchange process is normally incomplete hence other cations such as $Mg^{2+}$, $Ca^{2+}$, $K^+$ may still be present.

The structure of a desired form of vermiculite so far as the present invention is concerned is illustrated in FIG. 2.

By way of background Vermiculite is the geological name given to a group of hydrated laminar minerals which are aluminium-iron-magnesium silicates, resembling mica in appearance. When subjected to sudden heat, vermiculite exfoliates i.e. expands due to the rapid inter-laminar generation of steam.

Vermiculite can also be exfoliated by a chemical route to create a slurry of vermiculite lamellae in water. This is achieved by taking some Vermiculite ore which has been washed, ground and graded and standing it in a concentrated aqueous solution of a monovalent salt such as Lithium or Sodium or an organo-cation salt such as n-butylammonium chloride. The monovalent ions exchange with the divalent magnesium or calcium ions within the Vermiculite. After further washing the product is allowed to stand in distilled water. Here the monovalent cations absorb water to become fully hydrated causing the chemically treated Vermiculite to swell to between 2 and 10 times its original size. This swollen Vermiculite is finally mechanically sheared into a dispersion of Vermiculite lamellae in water.

The resulting lamella have a very high aspect ratio i.e. the length or breadth divided by the thickness is very large. Typical measurements indicate that the lamellae range in thickness from 10 angstroms to 0.42 microns and a lamella length or breadth of about 20 microns. Thus the aspect ratio can be as high as 20,000.

The term vermiculite as used in the current invention is also take to mean all materials known mineralogically and commercially as vermiculite.

Though the term "solvent" is used with respect to the current invention in relation to the use of water, for the avoidance of doubt there is no significant amount of vermiculite that is dissolved in the processes described. It is believed that the vermiculite layer absorbs the water causing the vermiculite layer to swell.

There are numerous advantages associated with the release films/layers/agents of the present invention. The release layer has good thermal stability and solvent interaction particularly in water. The release film of the present invention provides an especially suitable substrate for deposition of metal thereon and the metal or non-metal layer may be released in aqueous conditions. The metal flakes obtained possess useful optical/electrical/mechanical and dispersing properties which are particularly useful for various inks and paint applications. In addition the substrate may be re-used.

It is also believed to be advantageous that the release films can be heated to high temperatures, in particular following deposition of the material; such high temperatures it is believed would degrade many of the known release agents. Although it is advantageous that in certain circumstances that materials (eg metal containing compounds) may be deposited (or later annealed) at high temperatures it is also a feature of the current invention that materials may be deposited at temperatures ranging from substantially room temperature upwards.

It is advantageous that certain materials when deposited may be heated to high temperatures, for example $VO_2$ was deposited at temperatures of around 450° C. Such high temperatures result in a form of $VO_2$ with a high degree of crystallinity which makes it suitable for a range of applications. Use of the release films of the present invention also allow for control of stoichiometry.

It is believed by the inventors of the current invention that the high crystalline version of $VO_2$ made according to the present invention has only been made previously when in contact with a substrate or support e.g. by other deposition methods.

By using the methods of the present invention, free standing, in particular high crystalline, thin film $VO_2$ has been made for what is believed to be the first time. This allows for the $VO_2$ to be further processed in ways up until now were not possible e.g. the $VO_2$ may be flaked and incorporated into for example paints or inks.

As such a further aspect of this invention is the provision of a free-standing thin film comprising a vanadium compound.

By free standing is meant the film (or sheet) is capable of independent existence in the absence of a supporting base. In addition the film may be of large area eg of areas up to and above A4 this may include areas significantly above A4.

Preferably the vanadium compound is $VO_2$.

More preferably the $VO_2$ has a high degree of crystallinity.

The vanadium compound may also be non-stoichiometric.

By thin film is preferably meant 0.005 to 50 microns thick, particularly from about 0.1 to about 5 microns and more particularly from about 0.25 to about 2 microns.

According to a further aspect of the current invention $VO_2$ flake is provided—preferably of high crystallinity. The flake is suitable for use as a pigment in a paint/coating, moreover it is suitable for being incorporated with a binder.

Other materials suitable for deposition and flaking include $WO_3$, in particular electrochromic crystalline $WO_3$.

DETAILED DESCRIPTION

Figure 1:
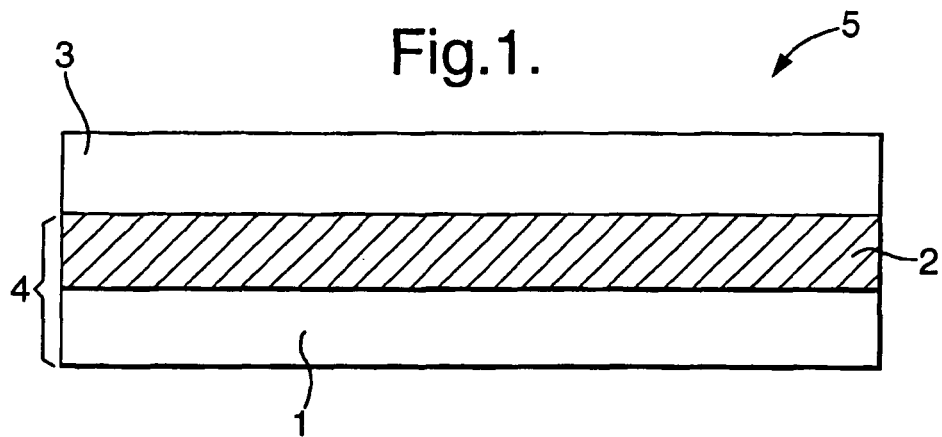
FIG. 1 illustrates a device/method of the present invention.
Figure 2:
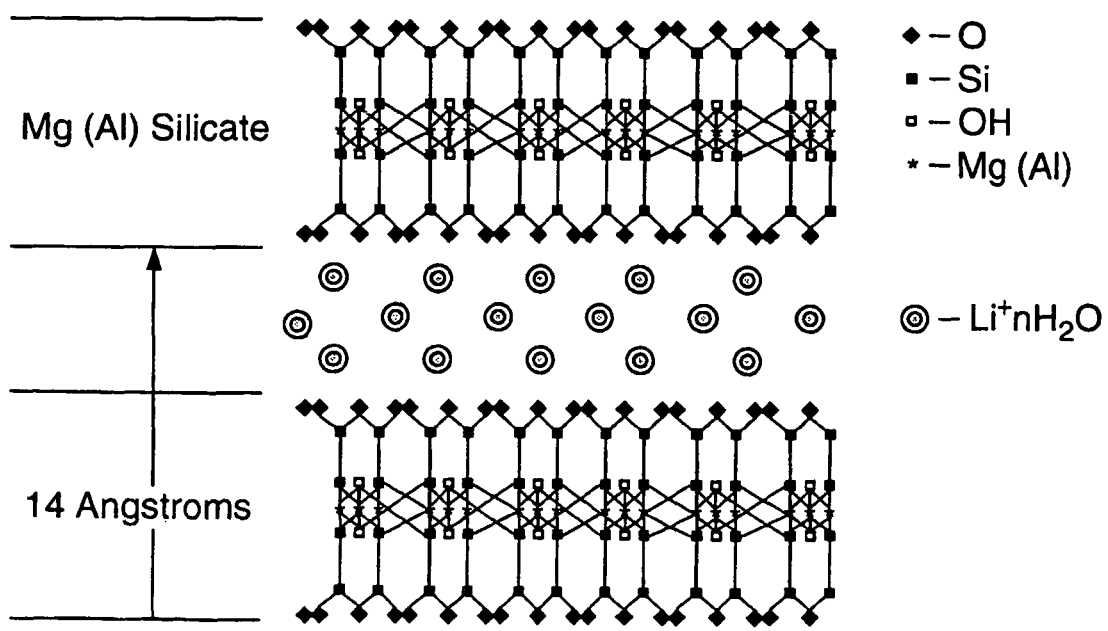
FIG. 2 is vermiculate clay delaminated with mono valent Lithium ions.

Typically, according to FIG. 1 a release film (4) comprises a substrate (1) e.g. a polymer such as Kapton® on to which is coated a release layer (2) which is a mixture comprising vermiculite plus binder and optionally a surfactant. The mixture is typically added to the substrate in aqueous solution and is applied by any conventional coating technique such as dip coating, bead coating, reverse roller coating or slot coating. The coated film is then heated sufficiently that the coating eg the release layer adheres to the substrate. Typically this is at a temperature of 90-130° C.

Following heating the coated film is allowed to cool. The release film is then suitable for depositing a layer of material (3) on to the release layer (2). For the case when this is a metal containing compound, then so-called metallisation can be accomplished by any of the conventional methods used in the production of metallised films. These include vapour and vacuum deposition. Typical metals include aluminium, chromium, magnesium, copper, vanadium, nickel, zinc, tin, silver, gold, titanium, silicon, bismuth or any compound containing the foregoing metals or combination thereof. These compounds include oxides, nitrides, fluorides and carbides.

Deposition of $VO_2$ by reactive RF sputtering is a well-established process. Generally deposition of good quality crystalline $VO_2$ requires a heated substrate, precluding its growth in a box coater facility without considerable modification.

Figure 3A:
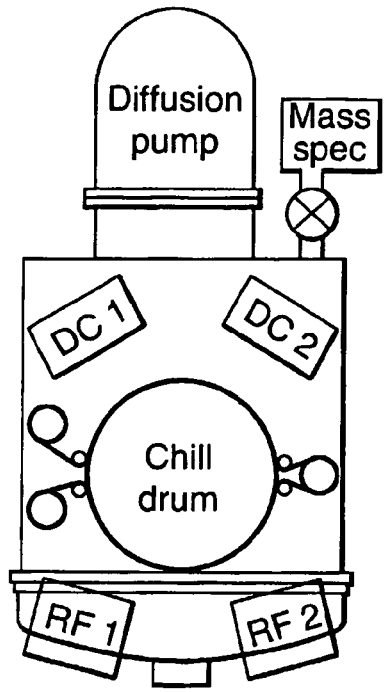
FIGS. 3a and 3b are schematic diagrams of deposition equipment used in the current invention.
Figure 3B:
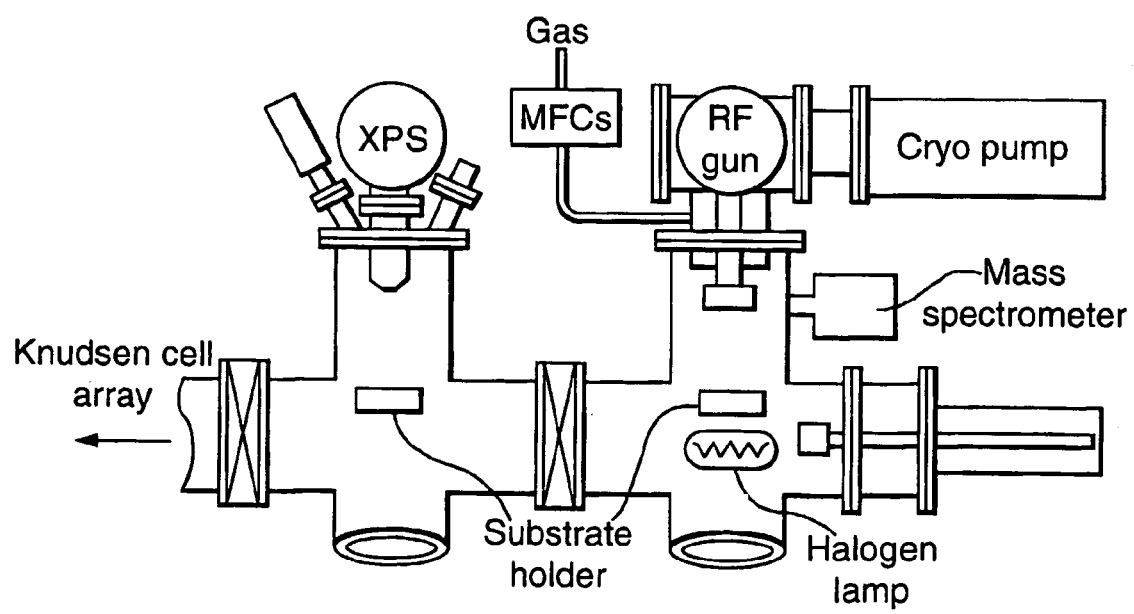

FIG. 3a shows a small scale rapid prototyping facility based on a modified Balzers 760 box coater which in the configuration depicted shares many of the features of a commercial sputter coating plant. FIG. 3b shows part of a UHV 'cluster tool' which features an array of Knudsen cells for thermal evaporation, Auger and XPS for surface analysis, halogen lamp array for substrate heating and an RF magnetron sputter gun. Both of the pieces of equipment shown in FIGS. 3a and 3b are equipped with mass spectrometers and quartz crystal monitors to enable reactive sputtering.

It is also possible to use the so-called SOL-GEL technique for depositing layers. Switchable vanadium oxide films obtained by a sol-gel process are described in Partlow et al J. Appl. Phys. 70(1), July 1991. It is thought that the SOL-GEL technique may result in more porous layers being formed which have a higher degree of contaminants when compared with the other (high temp) deposition techniques eg RF sputtering. It is also noted that Partlow et al appear to have made inter alia $VO_2$ films in contact with substrates.

The metallised release film (5) can then be immersed or exposed to a solvent such as water. The metal layer (3) is released either in substantially flake-form or substantially a single sheet. The flakes or single sheet may then if desired be further processed to a desired size as described in U.S. Pat. No. 5,135,812 which is incorporated herein by reference. For the case when appliqués are required the metallised release film is not exposed to a solvent but an adhesive layer is deposited on to the metal followed optionally by a liner or release paper/film. In order to apply the metal coating to a surface the interface between metal plus release layer is broken e.g. by use of rollers, the liner if present is removed so that the metal layer can be applied to a surface.

The vanadium compounds, particularly the $VO_2$ obtainable by the present invention are suitable for use in energy efficient systems such as windows and the like, for example see Babulanam et al in Solar Energy Materials, 16, 1987, pp347-63, in particular for use in thermochromic coatings. Thermochromic films are examples of smart materials which may be modified with respect to their electrical characteristics and/or optical (transmission, reflection, absorption) properties/constants in response to thermal stimuli.

The present invention allows for the provision of highly crystalline $VO_2$ which may be formed into coatings e.g. paint and the like. Once in coating form then the $VO_2$ is readily applied, alternatively the $VO_2$ may be applied using the applique technique. A highly crystalline version of $VO_2$ is likely to be more suitable for smart applications and because the techniques of the current invention allow for deposition at high temperatures this is particularly advantageous because this results in higher crystallinity.

As such a further aspect of the invention comprises a surface or product coated with a coating comprising $VO_2$ obtainable by the methods of the present invention.

Objectives of such a coating insofar as it relates to energy efficient windows and the like include increased values of $T_{lum}$ and preferably values of $\tau_c$ as defined in Babulanam et al.

Depending on the final application it may be advantageous that some of the released material retains small quantities of binder and/or vermiculite. It is believed that in the current invention that in certain circumstances the layer (2) (see FIG. 1) may have higher concentrations of binder at the interfaces of layer (2) with layer (1) and layer (3). This may result in mechanical breakage or shearing of the layer (2) during release i.e. the layer (2) is broken significantly in to the body of layer (2). A substantial amount of layer (2) still being in contact with now released layer (3) may provide a barrier to oxygen and may be particularly useful in the provision of layers that may be susceptible to further degradation eg oxidation, for example VO2. Hence the retained material (binder plus vermiculite) is capable of modifying chemical properties of the released layer.

Should increased amounts of layer (3) be required to stay in contact with the released material, it may be advantageous to actively delaminate the layers, e.g. by fixing adhesive tape or the like to layer 3 and then pulling it, then mechanical breakage and/or shearing may occur in the body of the layer (2) in FIG. 1. In this instance this technique is exploiting the mechanically weak plane of failure.

The following examples are further illustrative of the invention

Coating Formulation 1

Coating formulation 1 was prepared by dissolving 1 g methoxymethyl methylol melamine formaldehyde (80%) in 10 ml distilled water and then adding 40 ml of Microlite 963 Dispersion (7.5%). Microlite is commercially available from W. R. Grace, 62 Whitemore Avenue, Cambridge, Mass., USA and is vermiculite defoliated with a water soluble Lithium salt. The melamine formaldehyde used was CYMEL® 385 resin, commercially available from Cytec Industries Inc, The Netherlands.

Coating Formulation 2

Coating formulation 2 was prepared by taking coating formulation 1 and adding 0.1 g of Synperonic NP10 i.e. nonyl phenol ethoxalate surfactant.

In both of the above formulations the melamine formaldehyde is present as a binder.

Experiment 1

Coating formulation 2 was coated onto a sheet of 200HN Kapton film with a No 0 Meyer Bar. The film was then placed in an oven at 115° C. and dried for 3 minutes. This resulted in a coating free of bubbles. A similar result was obtained when a No 5 Meyer Bar was used.

Kapton® film is commercially available from Dupont.

Example of Metallisation

One method that may be adopted is a two-stage deposition process. Stage one is DC sputter deposition of vanadium metal onto a polymer web in the box coater facility. Stage two is the controlled oxidation of the vanadium layer in a vacuum furnace.

The metallised polymer is placed in a triple zone vacuum tube furnace and pumped down to $\sim 10^{-3}$ mbar at 100° C. overnight to remove oxygen and water. It is then ramped up to the processing temperature of 430° C. and the furnace is sealed before a controlled dose of an oxygen/argon mixture is let in. The volume of gas employed is calculated to give a 2:1 ratio of oxygen to vanadium to control the stoichiometry of the resulting oxide. The furnace is then left at 430° C. for 10 hours to allow complete oxidation to take place. The resulting material is crystalline $VO_2$ with good switching characteristics.

FIG. 3b illustrates a deposition facility equipped with a heater stage used to reactively sputter $VO_2$ on to a substrate (eg polyimide) which has already been coated with a mixture of vermiculite plus binder at temperatures up to about 430° C. In-situ analysis of the deposited $VO_2$ indicates that the $VO_2$ is substantially stoichiometric and free of contaminants.

This method has allowed creation of $VO_2$ samples of much larger scale than previously possible. The size of samples processed is restricted by the size of the available furnace. A particular example obtained using the above techniques was 300×250 mm. This allows for bulk preparation of $VO_2$ flake.

The metallised film was then subjected to a water bath in which one or more surfactants may be present.

The release may also optionally involve mechanical interaction.

In all aspects of the present invention layer minerals as described in U.S. Pat. No. 5,571,614 which is hereby incorporated by reference may be incorporated instead of or in addition to vermiculite. Examples include laponite plus smectites hectorite and montmorillonite.

In all aspects of the present invention the release layer, e.g. (2) in FIG. 1 may be present on only some selected parts of the substrate (1). As such the release layer may be present in particular patterns, shapes or designs. Following coating of a layer of material, e.g. (3) in FIG. 1 it is then possible to release material of a desired design. For example if the, in this case, part present layer (2) and layer (1) are coated by a metal containing layer (3) then following release, some of the metal coating will stay in contact with layer (1) whilst a particular metallised shape will be released. It could also be that the "desired" shape or design is left in contact with the layer (1). In certain circumstances following coating of the layer (2) it may the case that it is difficult to make contact between water and the patterned layer (2) because in effect the layer (2) is covered on all sides by layer (3). For this reason it may be necessary in the pattern to incorporate pathways or channels of layer (2) such that water (or other "solvent") can come into contact with layer (2) to facilitate release. Alternatively channels of space may be used.

In all aspects of the present invention the vermiculite or mineral layer may be ground or milled in to a finely divided substance. Typically this grinding or milling process would take place prior to mixing with any binder that may be present. This ground version is of particular use for applications described in the previous paragraph where particular shapes and the like are required. The ground vermiculite or mineral may be as low as 0.1 μm in diameter. The use of ground vermiculite means that the definition of any shape or design could be very accurately controlled or preserved. Other advantages of using a ground material are that when processing the release film it would allow for decreased drying time of the coated substrate and reduced blistering owing to the decrease in barrier effect of going from a larger plate like structure to a more finely divided ground structure. It may also improve the ingress of water during the stripping process.

Figure 4:
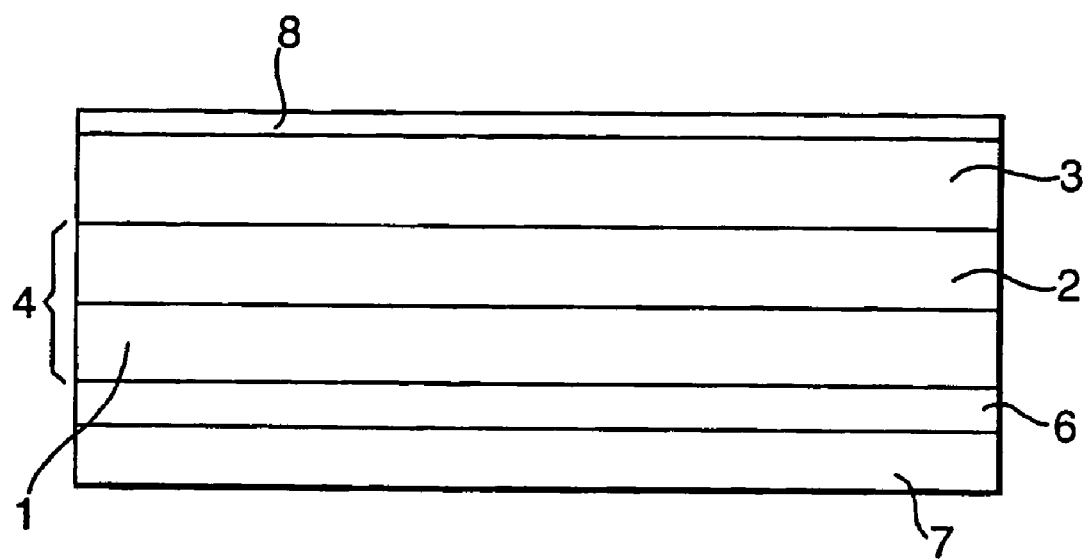
FIG. 4 illustrates a device/method of the present invention.

Further aspects of the current invention are provided by all of those release films (including preferred features) described by the current invention for use in anti-tamper devices. An example of such a device/method is shown in FIG. 4. In FIG. 4 the substrate layer (1) may have an adhesive layer (6) in contact with it and optionally a further lining layer (7) such that the substrate (1) may be adhered to a surface such as a container. On top of layer 3 is deposited a further layer (8) typically an adhesive layer such that it adheres to layer 3. The layer (8) may have a liner layer in contact with it (not shown) or be laminated.

In use the layer 1 is stuck to a surface, having first removed (if present) the layer (7). On attempted removal of the release film from the surface then the interface between the layers 2 and 3 will be broken and some of the layer (3) will be stuck to the adhesive layer (8) and some of it will remain on the release layer (2).

Should layer (3) be of a particular pattern as described above then any attempt to re-stick layer (3) will not be possible due to the nature of the pattern. It will be evident that the tape has been removed and replaced. For further authentication means any metal deposited in layer (3) could be part of an electrical circuit, such that breakage of the circuit causes an alarm to be activated.

In an alternative embodiment to FIG. 4 the layer 3 may be stuck to the object and it would not normally be necessary to have layers 6 and 7 present. If this is the case then the layer (8) is an adhesive layer which may have a further lining layer or be laminated (not shown). In use layer (1) would be gripped and removed—such action would cause a break at the interface between layers (2) and (3) such that a layer of (3) e.g. a metal layer was left in contact with the surface of the object. It may be arranged such that the deposited layer on the object was of a particular design, for example it could spell a word such as "VOID".

Such tamper-proof containers and sealants are of use in many aspects of industry, including food, pharmaceutical/chemical and the electronics industry.

The fact that any deposited layer is released in water in certain circumstances may be of advantage for indicating whether or not a seal had been damaged or tampered with.

The invention claimed is:

1. A release film having a layer of material comprising a metal or metal-containing compound deposited thereon, said release film comprising a substrate coated on at least one surface thereof with a release layer, said release layer comprising a layered silicate and having said material layer deposited thereon by a deposition process so as to form a thin film of 0.005 to 50 microns, said deposited material layer being releasable to obtain said material, wherein the release layer comprises a layered silicate plus binder and wherein the binder comprises melamine fomaldehyde and/or a derivative thereof.

2. A release film according to claim 1, wherein the substrate comprises a polyimide substrate or a metal substrate.

3. A release film according to claim 1, wherein the layered silicate comprises one or more silicates selected from vermiculite, laponite, hectorite, montmorillonite or other smectite.

4. A release film according to claim 3, wherein the layered silicate comprises vermiculite.

5. A release film according to claim 1, wherein the deposited material of a metal or metal-containing compound has been deposited by vacuum or vapour deposition.

6. A release film according to claim 1, wherein the deposited material comprises a metal or metal compound selected from aluminium, chromium, magnesium, copper, vanadium, nickel, zinc, tin, silver, gold, titanium, silicon, bismuth or oxides, nitrides, fluorides and carbides thereof.

7. A release film according to claim 6, wherein the metal compound is $VO_2$.

8. A release film according to claim 1, wherein the layer of deposited material comprises a series of layers.

9. A release film according to claim 1, wherein the thickness of the release layer is 0.02 - 2 microns.

10. A release film having a layer of material comprising a metal or metal-containing compound deposited thereon, said release film comprising a substrate coated on at least one surface thereof with a release layer, said release layer comprising a layered silicate and having said material layer deposited thereon by a deposition process so as to form a thin film of 0.005 to 50 microns, said deposited material layer being releasable to obtain said material wherein a layer of adhesive is deposited on the layer of deposited material, and a removable liner is disposed in contact with the layer of adhesive.

11. A method of making a release film having a layer of material comprising a metal or metal-containing compound deposited thereon, said release film comprising a substrate coated on at least one surface thereof with a release layer, said release layer comprising a layered silicate and having said material layer deposited thereon by a deposition process so as to form a thin film of 0.005 to 50 microns, said deposited material layer being releasable to obtain said material, said method comprising the steps of;

coating a substrate on at least one surface thereof with an aqueous solution of layered silicate, heating the coated substrate at a temperature sufficient for drying the layered silicate to the film, depositing a layer of material comprising a metal or metal-containing compound onto the coated film by a deposition process so as to form a thin film of 0.005 to 50 microns, said deposited material layer being releasable to obtain said material, and releasing the layer of material from the coated film, wherein the layer of material is released in aqueous conditions.

12. A method of making a release film according to claim 11, wherein the layer of material is deposited by a vapour or vacuum deposition process.

13. A method of making a release film according to claim 11, wherein heat is applied before and/or during and/or after the deposition of the layer of material.

14. A method according to claim 13, wherein the heating occurs at a temperature of 150° C. or above.

* * * * *